(12) United States Patent
Felix et al.

(10) Patent No.: US 11,449,309 B2
(45) Date of Patent: Sep. 20, 2022

(54) HARDWARE MODULE FOR CONVERTING NUMBERS

(71) Applicant: GRAPHCORE LIMITED, Bristol (GB)

(72) Inventors: Stephen Felix, Bristol (GB); Mrudula Gore, Bath (GB)

(73) Assignee: GRAPHCORE LIMITED, Bristol (GB)

( * ) Notice: Subject to any disclaimer, the term of this patent is extended or adjusted under 35 U.S.C. 154(b) by 0 days.

(21) Appl. No.: 16/646,507

(22) PCT Filed: Jun. 21, 2019

(86) PCT No.: PCT/EP2019/066477
§ 371 (c)(1),
(2) Date: Mar. 11, 2020

(87) PCT Pub. No.: WO2020/126124
PCT Pub. Date: Jun. 25, 2020

(65) Prior Publication Data
US 2021/0091786 A1    Mar. 25, 2021

(30) Foreign Application Priority Data
Dec. 21, 2018    (GB) ..................................... 1821120

(51) Int. Cl.
*G06F 7/483*    (2006.01)
*H03M 7/04*    (2006.01)
(Continued)

(52) U.S. Cl.
CPC .............. *G06F 7/483* (2013.01); *G06F 7/588* (2013.01); *H03M 7/04* (2013.01); *H03M 7/24* (2013.01)

(58) Field of Classification Search
CPC ..... G06F 7/00; G06F 7/02; G06F 7/38; G06F 7/483; G06F 7/58–588; H03M 7/04–24
See application file for complete search history.

(56) References Cited

U.S. PATENT DOCUMENTS 3,786,490 A    1/1974    Hallock
4,218,749 A    8/1980    Babaud et al.
(Continued)

FOREIGN PATENT DOCUMENTS

CN    101394266    3/2009
CN    101674180    3/2010
(Continued)

OTHER PUBLICATIONS

Lecture Notes on "Secure Coding in C and C++ Integer Security". Spring 2007. Retrieved on [Jul. 20, 2021], Retrieved from the Internet <http://www.sis.pitt.edu/jjoshi/courses/IS2620/Spring07/Lecture6.pdf> (Year: 2007).*

(Continued)

*Primary Examiner* — Michelle T Bechtold
*Assistant Examiner* — Carlo Waje
(74) *Attorney, Agent, or Firm* — Haynes and Boone, LLP (57) ABSTRACT

A hardware module comprising circuitry configured to: store a sequence of n bits in a register of the hardware module; generate a signed integer comprising a magnitude component and a sign bit by: if the most significant bit of the sequence of n bits is equal to one: set each of the n−1 of the most significant bits of the magnitude component to be equal to the corresponding bit of the n−1 least significant bits of the sequence of n bits; and set the sign bit to be zero; if the most significant bit of the sequence of n bits is equal to zero: set each of the n−1 of the most significant bits of the magnitude component to be equal to the inverse of the (Continued)

corresponding bit of the n−1 least significant bits of the sequence of n bits; and set the sign bit to be one.

22 Claims, 9 Drawing Sheets

(51) Int. Cl.
*H03M 7/24* (2006.01)
*G06F 7/58* (2006.01)

(56) References Cited

U.S. PATENT DOCUMENTS

| | | | |
|---|---|---|---|
| 4,520,347 A | 5/1985 | Campbell | |
| 5,148,161 A | 9/1992 | Sako | |
| 6,269,384 B1* | 7/2001 | Oberman | G06F 7/53 |
| | | | 708/497 |
| 6,542,539 B1 | 4/2003 | Larsson | |
| 2003/0023653 A1* | 1/2003 | Dunlop | G06F 30/30 |
| | | | 708/551 |
| 2004/0128331 A1* | 7/2004 | Hinds | G06F 9/30025 |
| | | | 708/204 |
| 2007/0220076 A1 | 9/2007 | Hinds | |
| 2007/0258641 A1* | 11/2007 | Srinivasan | H04N 1/407 |
| | | | 382/166 |
| 2010/0042892 A1 | 2/2010 | Gunnam | |
| 2011/0119321 A1 | 5/2011 | Ishikawa | |
| 2014/0321645 A1* | 10/2014 | Koo | H04L 9/0838 |
| | | | 380/46 |
| 2016/0211862 A1 | 6/2016 | Ho | |
| 2016/0224318 A1* | 8/2016 | Ho | H03M 7/24 |

FOREIGN PATENT DOCUMENTS

| | | |
|---|---|---|
| CN | 104009848 | 8/2014 |
| CN | 108287681 | 7/2018 |

OTHER PUBLICATIONS

Doornik, J. A. 2007. Conversion of high-period random numbers to floating point. ACM Trans. Model. Comput. Simul. 17, 1, Article 3 (Jan. 2007), 5 pages. DOI:10.1145/1177357.1177360 http://doi.acm.org/10.1145/1177357.1177360 (Year: 2014).*
Patterson et al., "Computer Organization and Design: The Hardware/Software Interface", Fifth Edition, 2014. Retrieved from <https://ict.iitk.ac.in/wp-content/uploads/CS422-Computer-Architecture-ComputerOrganizationAndDesign5thEdition2014.pdf> (Year: 2014).*
International Search Report and Written Opinion for PCT/EP/2019/066477 dated Sep. 10, 2019.
Kang, "FPGA Implementation of Gaussian-distributed pseudo-random number generator", Deparment of Electrical Engineering, Seoul National University, Seoul Korea.
Combined Search and Examination Report for GB Application No. GB1821120.1 dated Sep. 11, 2019.
Office Action dated Jan. 19, 2022 for Chinese Patent Application No. 201980077105.8.

* cited by examiner

Prior art

HARDWARE MODULE FOR CONVERTING NUMBERS

This patent application is a U.S. National Stage patent application of International Patent Application No. PCT/EP2019/066477 filed on Jun. 21, 2019, the benefit of which is claimed, and claims priority to and benefit of the filing date of United Kingdom Patent Application No. 1821120.14 filed on Dec. 21, 2018, each of which is incorporated by reference herein in its entirety.

TECHNICAL FIELD

The present disclosure relates to a hardware module for converting numbers, and more specifically to a hardware module for producing a centred distribution of numbers.

BACKGROUND

In computing, bit sequences of predefined sizes are used to represent numbers. The particular representation of the bit sequence determines how a bit sequence is interpreted.

One form of representation is the integer representation, which may be signed or unsigned. An unsigned integer consists of a series of bits representing the magnitude of a positive integer. A signed integer also comprises a series of bits representing the magnitude, and additionally comprises a sign bit. The value of the sign bit indicates whether or not the integer is positive or negative.

Alternatively, the floating-point representation is often used to approximately represent real numbers. The floating-point representation comprises 3 separate components, i.e. a sign component, a mantissa component, and an exponent component. In the single-precision (i.e. 32-bit) floating point representation, the sign component consists of a single bit, the exponent consists of 8 bits, and the mantissa consists of 23 bits. In the half-precision (i.e. 16-bit) floating-point representation, the sign component consists of a single bit, the mantissa consists of 10 bits, and the exponent consists of 5 bits. In most cases, a number is given from these 3 components by the following formula:

$$(-1)^{signbit} \times 1.\text{mantissa} \times 2^{exponentbits-offset}$$

The displayed "offset" to the exponent is dependent upon the number of bits used to represent the exponent, which is dependent upon the precision level. In the single-precision representation, the offset is equal to 127. In the half-precision format, the offset is equal to 15.

Here "1" is an implicit bit, which is derived from the exponent. In the case that the exponent bit sequence consists of anything other than all zeros or all ones, the implicit bit is equal to one and the number is known as a "Norm". In this case, the floating point number is given by:

$$(-1)^{signbit} \times 1.\text{mantissa} \times 2^{exponentbits-offset}$$

In the case that the exponent bit sequence consists of all zeros, the implicit bit is equal to zero and the number is known as a "DNorm". In this case, the floating point number is given by:

$$(-1)^{signbit} \times 0.\text{mantissa} \times 2^{exponentbits-offset}$$

The DNorms are useful, since they allow smaller numbers to be represented than would otherwise be representable by the limited number of exponent bits.

The other circumstance—in which the exponent bit sequence consists of all ones—may be used to represent infinity.

The floating point representation may be used to represent numbers in implementations of neural network processing. An implementation of neural networks involves the storage and manipulation of such floating point numbers. Neural networks are used in the field of machine learning and artificial intelligence. Neural networks comprise arrangements of sets of nodes which are interconnected by links and which interact with each other. The principles of neural networks in computing are based on information about how electrical stimuli convey information in the human brain. For this reason the nodes are often referred to as neurons. They may also be referred to as vertices. The links are sometimes referred to as edges. The network can take input data and certain nodes perform operations on the data. The result of these operations is passed to other nodes. The output of each node is referred to as its activation or node value. Each link is associated with a weight. A weight defines the connectivity between nodes of the neural network. Many different techniques are known by which neural networks are capable of learning, which takes place by altering values of the weights.

Figure 1:
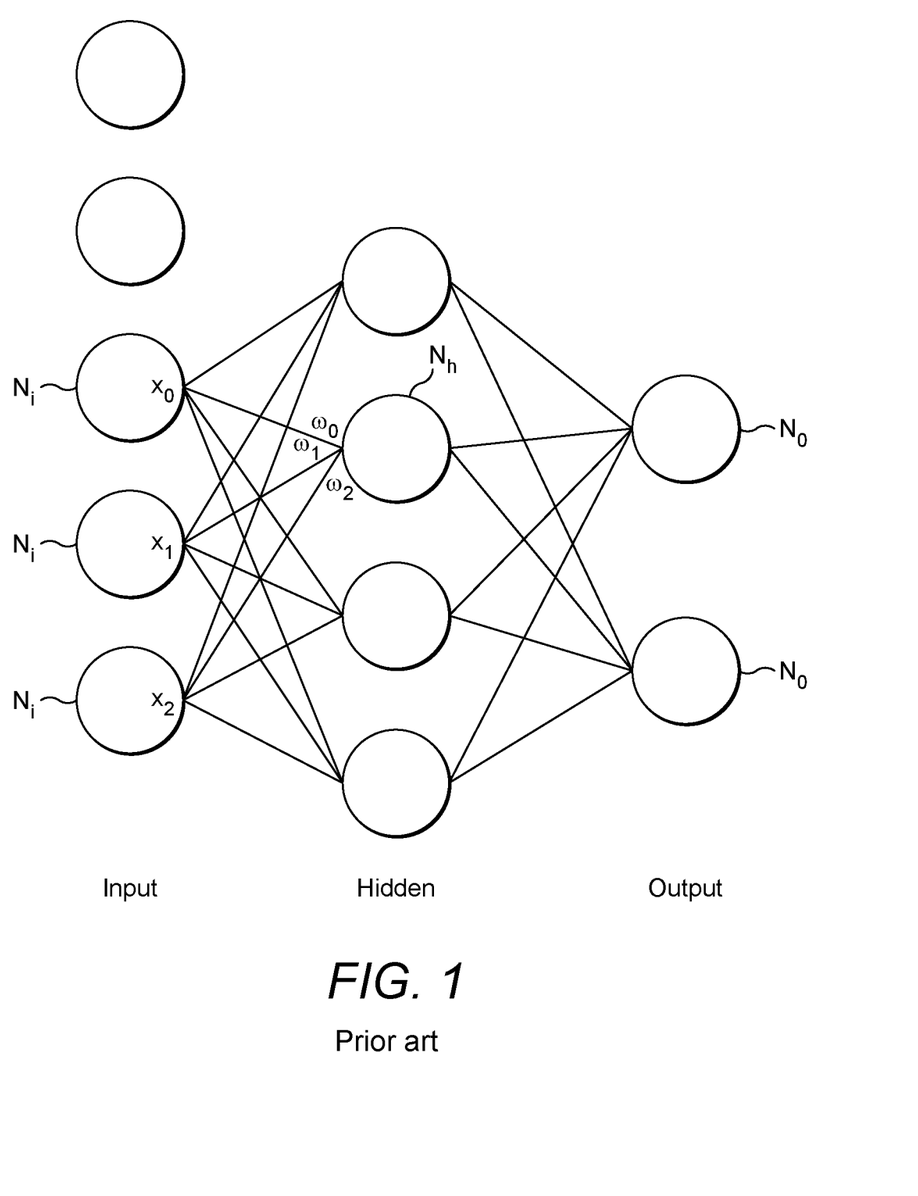
FIG. 1 is a highly simplified schematic view of a neural net.
Figure 1A:
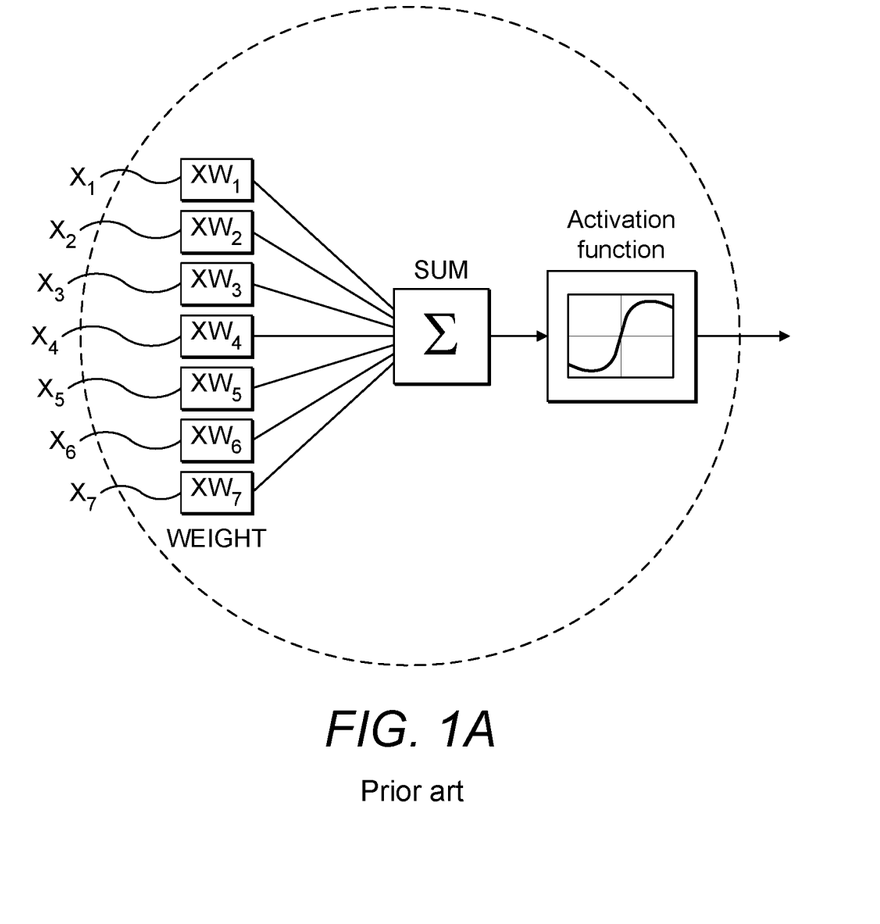
FIG. 1A is a highly simplified schematic view of a neuron.

FIG. 1 shows an extremely simplified version of one arrangement of nodes in a neural network. This type of arrangement is often used in learning or training and comprises an input layer of nodes, a hidden layer of nodes and an output layer of nodes. In reality, there will be many nodes in each layer, and nowadays there may be more than one layer per section. Each node of the input layer $N_i$ is capable of producing at its output an activation or node value which is generated by carrying out a function on data provided to that node. A vector of node values from the input layer is scaled by a vector of respective weights at the input of each node in the hidden layer, each weight defining the connectivity of that particular node with its connected node in the hidden layer. In practice, networks may have millions of nodes and be connected multi-dimensionally, so the vector is more often a tensor. The weights applied at the inputs of the node $N_h$ are labelled $w0 \ldots w2$. Each node in the input layer is connected at least initially to each node in the hidden layer. Each node in the hidden layer can perform an activation function on the data which is provided to them and can generate similarly an output vector which is supplied to each of the nodes $N_o$ in the output layer $N_O$. Each node weights its incoming data, for example by carrying out the dot product of the input activations of the node and its unique weights for the respective incoming links. It then performs an activation function on the weighted data. The activation function can be for example a sigmoid. See FIG. 1A. The network learns by operating on data input at the input layer, assigning weights to the activations from each node and acting on the data input to each node in the hidden layer (by weighing it and performing the activation function). Thus, the nodes in the hidden layer operate on the weighted data and supply outputs to the nodes in the output layer. Nodes of the output layer may also assign weights. Each weight is characterised by a respective error value. Moreover, each node may be associated with an error condition. The error condition at each node gives a measure of whether the error in the weight of the node falls below a certain level or degree of acceptability. There are different learning approaches, but in each case there is a forward propagation through the network from left to right in FIG. 1, a calculation of overall error, and a backward propagation from right to left in FIG. 1 through the network of the error. In the next cycle, each node takes into account the back propagated error and produces a revised set of weights. In this way, the network can be trained to perform its desired operation.

There are many calculations in neural networks which require random floating point numbers in the range of 0 to 1. There can be advantages to performing such calculations with a distribution of numbers that are instead centred on zero.

SUMMARY

Therefore, when presented with a sequence of n bits, it may be helpful to manipulate these bits somehow such that they represent a distribution of numbers centred on zero. Such a distribution has applications in neural networks.

Such a process for centring the distribution of numbers may be implemented in software, by, for example, subtracting half of the maximum value from the number. However, it is desirable to instead provide a hardware module capable of performing the process. Although a software implementation may appear simpler, the instructions need to be loaded into a processor and executed each time a number is to be converted. Therefore, implementing the process in software instead of hardware may lead to a less efficient process. However, to implement the process in hardware, it is desirable to avoid the use of the subtraction in hardware, which is demanding in terms of the hardware resources required. Therefore, implementing the centring process in hardware is not a straight forward implementation of the software function in hardware but requires careful consideration of the operations to be performed by the hardware so as to minimise the demands on the necessary circuitry.

Embodiments of the application may address one or more of these issues.

According to a first aspect of the invention, there is provided a hardware module comprising circuity configured to: store a sequence of n bits in a register of the hardware module; generate a signed integer comprising a magnitude component and a sign bit by: if the most significant bit of the sequence of n bits is equal to one: set each of the n−1 of the most significant bits of the magnitude component to be equal to the corresponding bit of the n−1 least significant bits of the sequence of n bits; and set the sign bit to be equal to zero; if the most significant bit of the sequence of n bits is equal to zero: set each of the n−1 of the most significant bits of the magnitude component to be equal to the inverse of the corresponding bit of the n−1 least significant bits of the sequence of n bits; and set the sign bit to be equal to one.

The magnitude component may be calculated by the hardware module. This may be achieved by multiplying the sequence of bits by two to generate a first intermediate; adding one to the first intermediate to generate a second intermediate; and subtracting two to the power of n from the second intermediate. The least significant bit of the magnitude component may be set to one.

The hardware module may comprise a NOT gate which receives the most significant bit of the sequence and output the sign bit. The hardware module may comprise a plurality of XNOR gates. Each XNOR gate receives the most significant bit of the sequence and one of the n−1 least significant bits of the sequence as inputs. It then provides the corresponding bit of the n−1 most significant bits of the magnitude component as an output.

There may be a random number generator which provides the sequence of n bits as a sequence of randomly generated bits.

A floating point number may be generated form the signed integer. A mantissa may be generated from the floating point number. This may be achieved by setting the sign of the signed integer equal to zero to produce an unsigned bit sequence. A left shift may then be performed on the unsigned bit sequence by an amount equal to the number of leading zeros of the unsigned bit sequence and then truncating the shifted unsigned bit sequence to a number of bits specified for the mantissa. The exponent of the floating point number may be set in dependence of the number of leading zeros. This exponent may be set to equal −1.

A plurality of signed integers in a distribution centred on zero may be generated from respective bit sequences. A plurality of floating point numbers in a distribution centred on zero may be generated from said respective bit sequence.

The circuitry of the hardware module may comprise at least one application specific integrated circuit and/or at least one field programmable gate array.

According to a second aspect of the invention, there is provided a method for generating a signed integer comprising a magnitude component and a sign bit, the method comprising: storing a sequence of n bits in a register of the hardware module; if the most significant bit of the sequence of n bits is equal to one: setting each of the n−1 of the most significant bits of the magnitude component to be equal to the corresponding bit of the n−1 least significant bits of the sequence of n bits; and setting the sign bit to be equal to zero; if the most significant bit of the sequence of n bits is equal to zero: setting each of the n−1 of the most significant bits of the magnitude component to be equal to the inverse of the corresponding bit of the n−1 least significant bits of the sequence of n bits; and setting the sign bit to be equal to one.

In some embodiments the method for generating a signed integer comprises a magnitude component and a sign bit, the method comprising: storing a sequence of n bits in a register of the hardware module; if the most significant bit of the sequence of n bits is equal to one: setting each of the n−1 of the most significant bits of the magnitude component to be equal to the corresponding bit of the n−1 least significant bits of the sequence of n bits; and setting the sign bit to be equal to zero; if the most significant bit of the sequence of n bits is equal to zero: setting each of the n−1 of the most significant bits of the magnitude component to be equal to the inverse of the corresponding bit of the n−1 least significant bits of the sequence of n bits; and setting the sign bit to be equal to one.

In some embodiments, the method comprises responsive to the instruction, setting the least significant bit of the magnitude component to be equal to one.

In some embodiments, the method comprises providing the sequence of n bits as a sequence of randomly generated bits.

In some embodiments, the method comprises generating a floating point number from the signed integer.

In some embodiments, the method comprises generating a mantissa of the floating point number is by: setting the sign bit of the signed integer equal to zero to produce an unsigned bit sequence; performing a left shift on the unsigned bit sequence by an amount equal to the number of leading zeros of the unsigned bit sequence; and truncating the shifted unsigned bit sequence to a number of bits specified for the mantissa.

In some embodiments, the method comprises setting an exponent of the floating point number in dependence upon the number of leading zeros.

In some embodiments, the method comprises generating a plurality of floating point numbers in a distribution centred on zero from said respective bit sequences.

In some embodiments, the method comprises calculating the magnitude component by: multiplying the sequence of bits by two to generate a first intermediate; adding one to the first intermediate to generate a second intermediate; and subtracting two to the power of n from the second intermediate.

According to a third aspect of the invention, there is provided a computer program product comprising a computer program which comprises a computer program instruction which when executed by the hardware module carries out the steps described above.

DETAILED DESCRIPTION

A pseudo random number generator (PRNG) generates uniformly distributed random bits. Calculations often need random floating point numbers in the range of 0 to 1 to represent probabilities. A su-from-ui circuit described herein provides conversion from a random unsigned integer to a signed integer. The signed integers are then suitable for conversion by the circuit to floating point numbers in the range −0.5 to 0.5.

Overall an n bit floating point number may be converted from an unsigned integer using the formula:

$$\text{float} = ((2 * \text{uint}) + 1 - 2^n) / 2^{(n+1)}$$

where n=the number of bits representing the mantissa of the floating point number. The largest representable magnitude with this scheme is $0.5 - (2^{-(n+1)})$. Embodiments of the application provide a hardware implementation of symmetric and uniform random floats.

A challenge is to convert bit sequences (which may be taken to represent unsigned integers) to a distribution of signed integers centred on zero. Such signed integers are then suitable for conversion to the floating point format to produce a distribution of floating point numbers centred on zero. One proposal to produce a signed integer is to make use of subtraction (or addition) functions. However, these are expensive. Some embodiments also provide, therefore, that subtraction is achieved by novel bit manipulation.

Embodiments of the application relate to a hardware module for converting a sequence of bits into a signed integer. The hardware module is further configured to convert the signed integer to a floating point number. Each bit sequence may represent a randomly generated value. The conversion process is such that a distribution of numbers that each undergo the conversion process will form a new distribution of numbers that are centred at zero.

In order to produce a floating point number, the hardware module is configured to first convert a randomly generated sequence of bits (which represents an unsigned integer) to a signed integer. The signed integer is calculated such that a distribution of signed integers that are calculated in this way is centred on zero. The signed integer is then converted to a floating point number.

The hardware module comprises one or more of: at least one application specific integrated circuit (ASIC) and at least one field programmable gate array (FPGA) or circuits/gates. The hardware module comprises a circuit, referred to as the 'symmetric uniform from unsigned integer circuit', configured to calculate a floating point number from an unsigned integer according to embodiments of the application. The 'symmetric uniform from unsigned integer circuit' comprises circuitry for converting a bit sequence representing an unsigned integer to a signed integer. The 'symmetric uniform from unsigned integer circuit' also comprises circuitry for converting a bit sequence representing a signed integer to a floating point number.

These hardware elements (i.e. the FPGA and/or ASIC or circuits/gates) are configured to receive a sequence of n bits and manipulate the bits in such a way as to shift them to an appropriate position in the new distribution. The sequence of bits may represent an unsigned integer which is converted to a floating point format. A number in the floating point format comprises a sign bit, a mantissa, and an exponent. No limitation as to the number of bits used to represent the number is intended by the use of the term "floating point format". In some embodiments, the number may be represented in single-precision floating point format and, therefore, consists of 32 bits. In other embodiments, the number may be represented in half-precision floating point format and, therefore, consists of 16 bits.

The hardware elements (i.e. the FPGA and/or ASIC or circuits/gates) are configured to determine the n−1 most significant bits (MSBs) of the magnitude component of the signed integer in dependence upon the n−1 least significant bits (LSBs) of the sequence of n bits provided to the hardware module.

In the case that the MSB of the sequence of n bits is equal to one, the hardware elements are configured to set each of the n−1 MSBs of the magnitude component of the signed integer equal to their corresponding bit of the n−1 LSBs of the sequence of n bits. In this case, the sign bit of the signed integer is set equal to one.

In the case, that the MSB of the sequence of n bits is equal to zero, the hardware elements are configured to set each of the n−1 MSBs of the magnitude component of the signed integer equal to the inverse of their corresponding bit of the n−1 LSBs of the sequence of n bits. In this case, the sign bit of the signed integer is set equal to zero.

In either case, the LSB of the signed integer is set equal to one.

The sequence of n bits that are received at the hardware module may be randomly generated by a random number generator. The randomly generated numbers received at the hardware module may form a uniform distribution of random numbers or may form an approximate Gaussian distribution. By modifying the randomly generated numbers in manner described above, a uniform, Gaussian, or some other form of distribution that is centred at zero may be formed. Techniques requiring a distribution of numbers centred on zero have applications in neural networks. Techniques have recently been devised for improving the performance of neural networks by adding random noise to weights or activations. Gaussian noise has been explored as a possibility in this respect. Techniques described herein for generating random numbers can be used to generate Gaussian noise as described in our earlier U.S. application Ser. No. 15/886,505, the contents of which are herein incorporated by reference. To provide the required noise, the Gaussian distribution in this example, is normalised and centred on zero.

Figure 7:
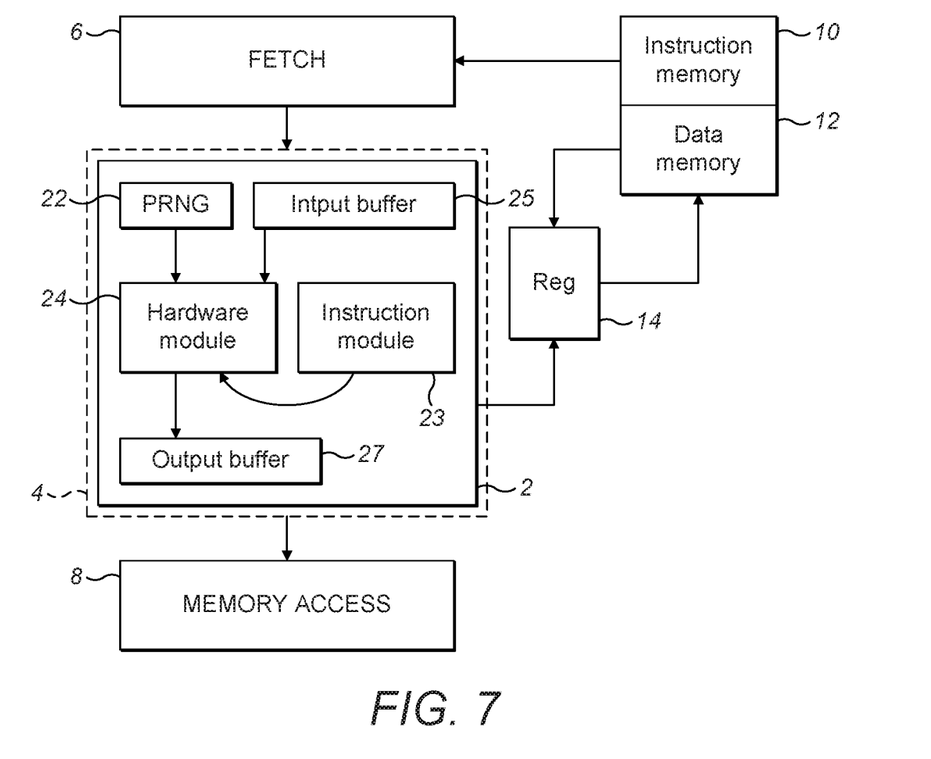
FIG. 7 is a schematic diagram of a processing unit in accordance with an embodiment of the invention.

Reference is made to FIG. 7 which illustrates an example of the use of such a hardware module 24 for generating the floating point numbers as described. FIG. 7 shows a schematic block diagram of an execution unit 2 arranged to execute a single instruction for generating a floating point number from an unsigned integer.

The execution unit 2 forms part of a pipeline 4 in a processing unit. The processing unit comprises an instruction fetch unit 6 which fetches instruction from an instruction memory 10. The processing unit also comprises a memory access stage 8 which is responsible for accessing a data memory 12 for loading data from the memory or storing data into the memory. A set of registers 14 is provided for holding source and destination operands for the instructions being executed at any instance by the pipeline 4. It will readily be understood that the pipeline 4 may contain many different types of execution unit for executing a variety of different instructions, for example for performing mathematical operations. One type of processing unit which may be useful with the present invention is a processing unit using barrel-threaded time slots, in which a supervisor thread may allocate different worker threads to different time slots for their execution.

The execution unit 2 comprises an instruction execution module 23, an input buffer 25, and an output buffer 27 for holding the result of execution of the instruction. The instruction execution module 23 is configured to execute an instruction to cause the hardware module 24 to generate a floating point number. The hardware module 24 is configured in response to such an instruction to convert a sequence of n bits received from a pseudo random number generator 22 and to provide the floating point number to the output buffer 27.

Through the execution of multiple instructions, multiple floating point numbers may be generated in a distribution centred at zero.

Figure 2:
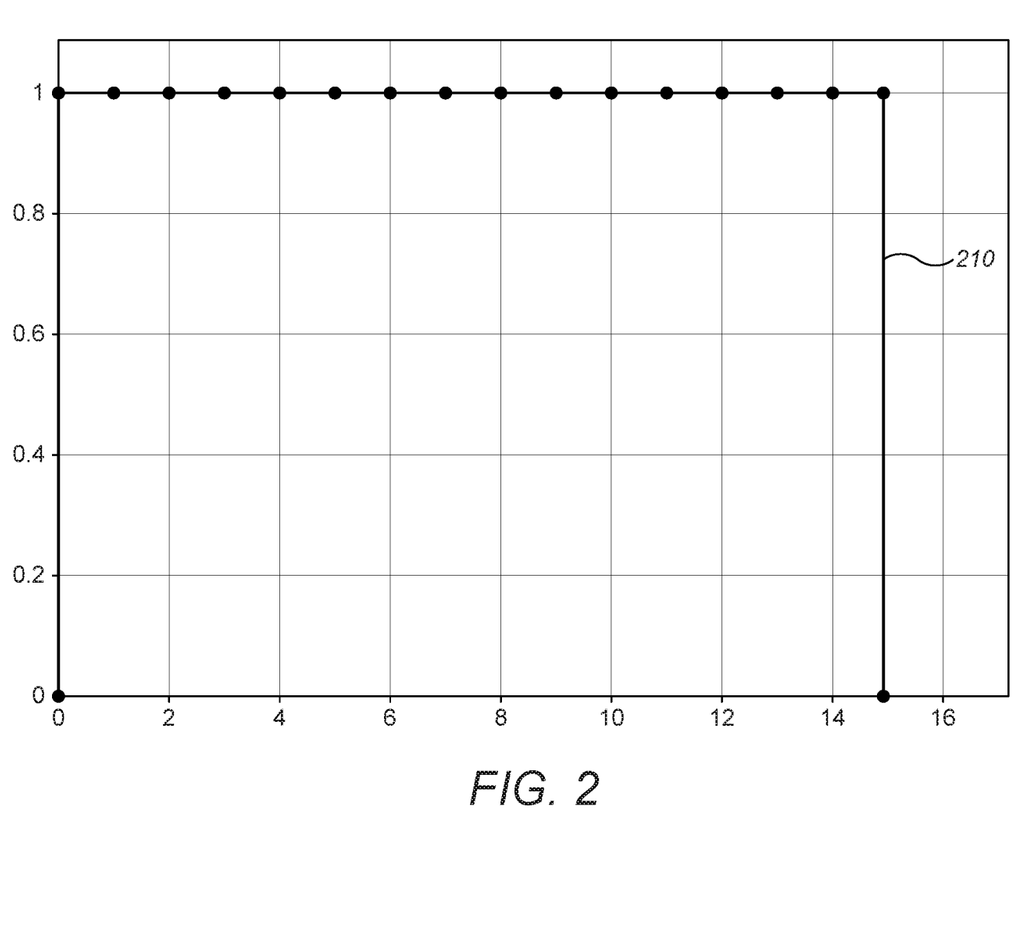
FIG. 2 shows an example non-symmetric distribution of values.

The sequence of n bits that are received at the hardware module may be understood to represent unsigned integers. These unsigned integers form an initial distribution. Reference is made to FIG. 2, which illustrates an initial distribution 210 of unsigned integers that may be received at the hardware module. The initial distribution 210 is a uniform distribution, reflecting the uniform distribution of numbers output by the random number generator.

In this example, n=4 (i.e. each unsigned integer is represented by 4 bits). Therefore, the maximum value that can be represented is 15, which is given by the bit sequence: 1111. The minimum value that can be represented is 0, which is given by the bit sequence: 0000. This is reflected in the distribution 210 which extends between 0 and 15.

Figure 3:
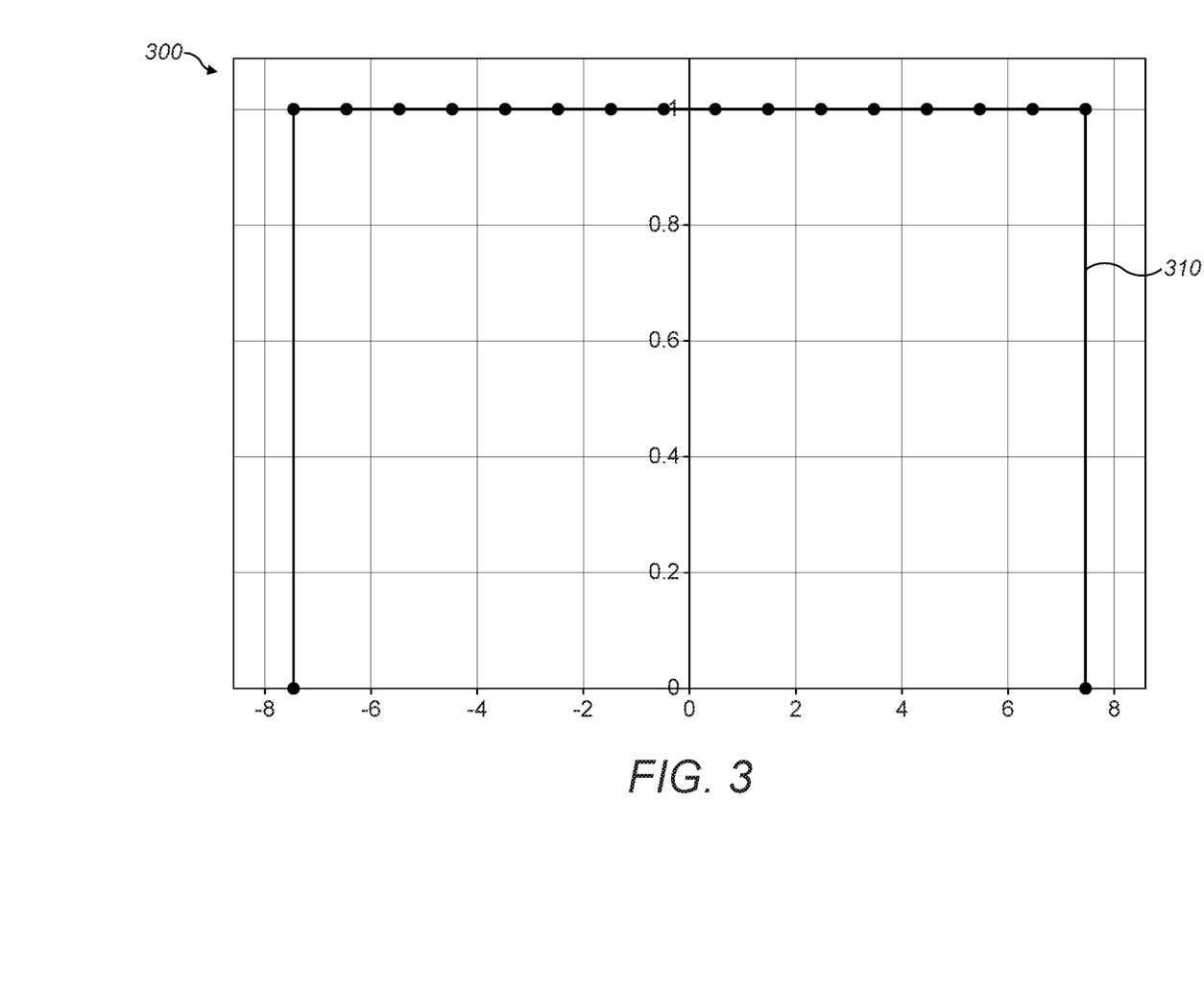
FIG. 3 shows an example symmetric distribution of values.

Reference is made to FIG. 3, which illustrates a distribution 310 of floating point numbers that is centred at zero. The distribution 310 represents the result of the sequence of n bits received at the hardware module as described. The range of the distribution, as for the initial distribution is 15. However, now the distribution extends between −7.5 and 7.5.

Figure 4:
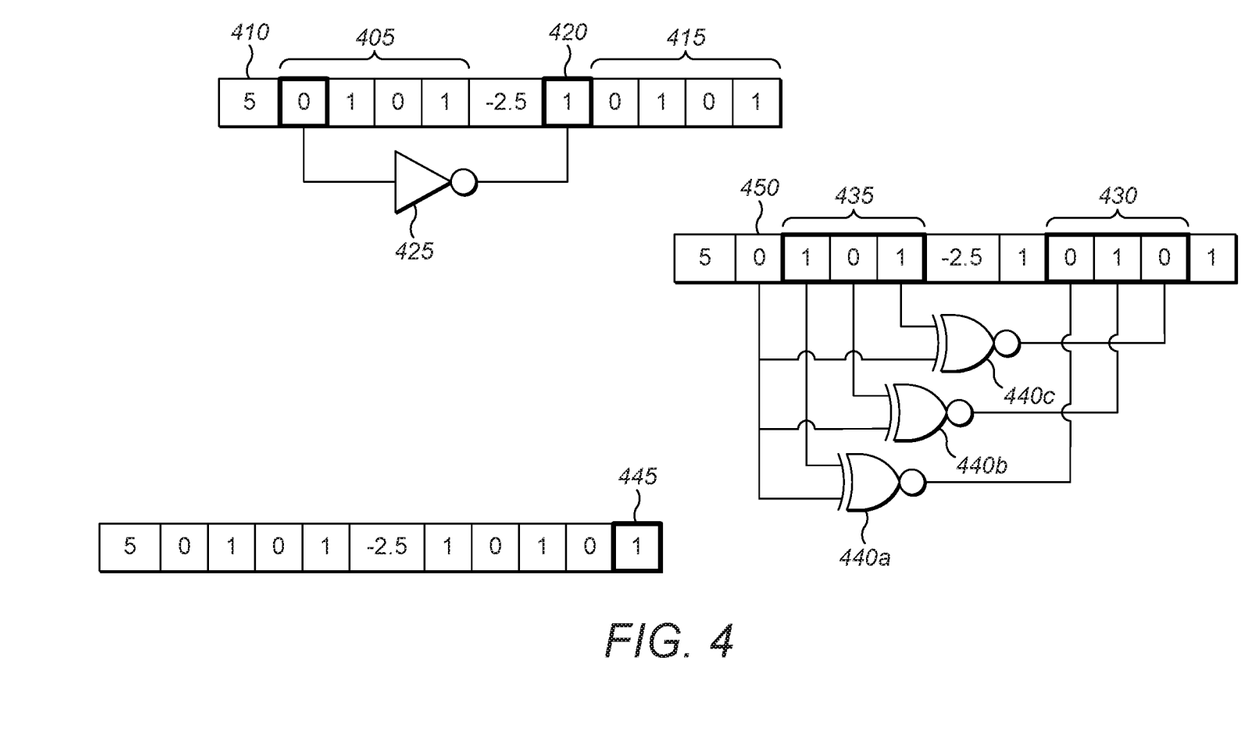
FIG. 4 shows an example of circuitry converting a value to floating point format.

Reference is made to FIG. 4, which illustrates circuity of the hardware module used for generating a signed integer from an unsigned integer. The signed integers are generated by this circuit in such a way that a resulting distribution is centred at zero.

In the example shown, the sequence of n bits 405 comprises the bit sequence 0101. FIG. 4 shows at 410 that this represents an unsigned integer of value 5. The magnitude 415 of the signed integer also comprises 4 bits. The signed integer additionally includes a sign bit 420.

To determine the value of the sign bit 420, the MSB of the sequence 405 of n bits is used an input to a NOT gate 425. The output is the sign bit 420. This has the effect of making the signed integer negative if the unsigned integer is less than half the maximum that is representable by the sequence of n bits. In this example, the sign bit 420 is set equal to 1 (representing a negative number), because the unsigned integer has a value (5) that is less than half (7.5) the maximum (15) that is representable by 4 bits.

FIG. 4 also shows the circuitry used to construct the n−1 MSBs 430 of the magnitude of the signed integer. These are calculated in dependence upon the n−1 LSBs 435 of the sequence of n bits.

The hardware elements comprise a plurality of XNOR (exclusive NOR) gates 440. There may be n−1 XNOR gates 440 provided. Each XNOR gate 440 is also configured to receive as an input one of the n−1 LSBs of the sequence of n bits and to provide its output to the corresponding bit of the n−1 MSBs 430 of the magnitude of the signed integer. Therefore, a first XNOR gate 440a is configured to receive a MSB of the n−1 LSBs 435 of the sequence of n bits and to output a MSB of the magnitude of the signed integer. A second XNOR gate 440b is configured to receive a $2^{nd}$ MSB of the n−1 LSBs 435 of the sequence of n bits and to output a $2^{nd}$ MSB of the magnitude of the signed integer. A third XNOR gate 440c is configured to receive a $3^{rd}$ MSB of the n−1 LSBs 435 of the sequence of n bits and to output a $3^{rd}$ MSB of the magnitude of the signed integer.

Each of the XNOR gates 440 is also configured to receive as an input, the MSB 450 of the sequence of n bits. By doing so, the XNOR gates 440 determine whether or not, the inputs of the n−1 LSBs 435 are to be inverted. In the example in FIG. 4, since the MSB 450 is equal to zero, each of n−1 LSBs 435 are inverted to form the n−1 MSBs of the magnitude of the signed integer. In other words, the inversion takes place since the value of the unsigned integer represented by the sequence of n bits is less than half the maximum possible value.

FIG. 4 also shows that the LSB 445 of the magnitude of the signed integer is set to 1. This is true irrespective of the values of sequence of n bits.

Figure 5:
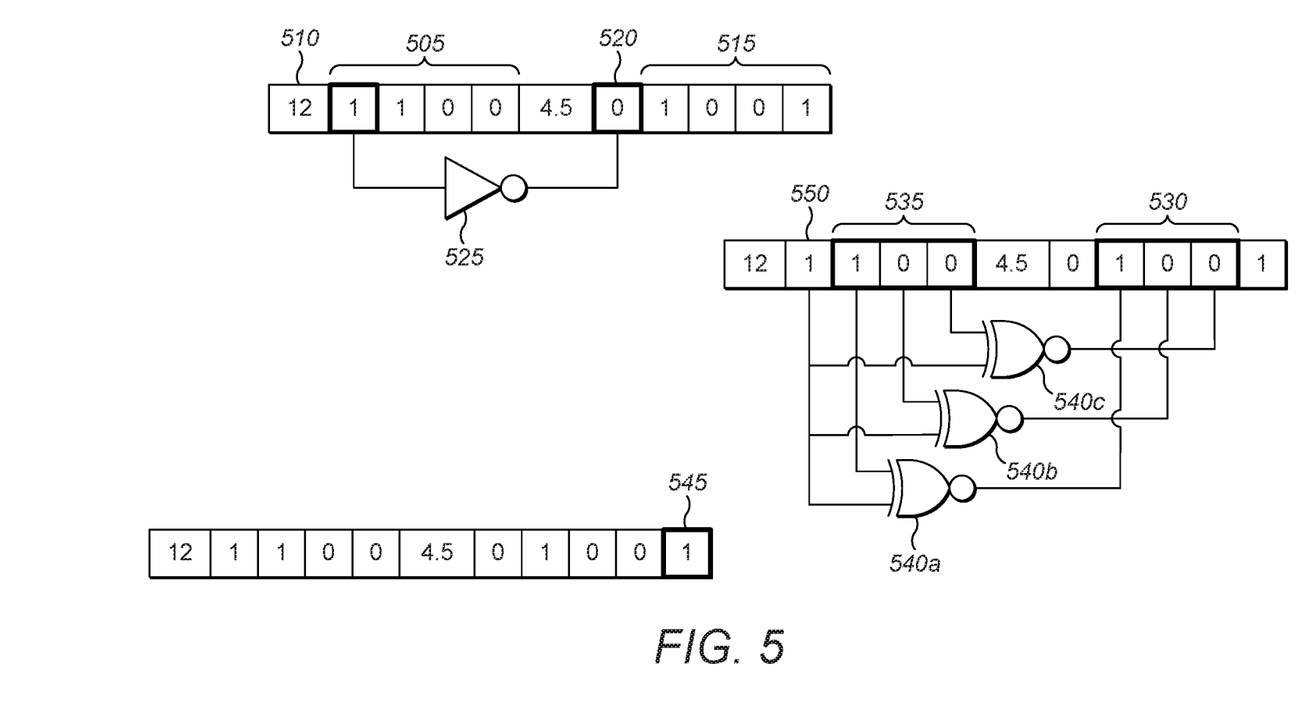
FIG. 5 shows an example of the circuity for converting a value to floating point format.

Reference is made to FIG. 5, which illustrates how the circuity for generating the signed integer is applied to a different sequence of n bits.

In the example shown, the sequence of n bits 505 comprises the bit sequence 1100. The Figure shows at 510 that this represents an unsigned integer of value 12. The magnitude of the signed integer 515 of the floating point number also comprises 4 bits. The signed integer additionally includes a sign bit 520.

To determine the value of the sign bit 520, the MSB of the sequence of n bits is used an input to a NOT gate 525. In this example, the sign bit 520 is set equal to 0 (representing a positive number), since the unsigned integer has a value (12) that is more than half (7.5) the maximum (15) that is representable by 4 bits.

FIG. 5 also shows how the circuitry is used to construct the n−1 MSBs 530 of the magnitude of the signed integer. As before, each of the XNOR gates 540 receive as an input, the MSB 550 of the sequence of n bits. In the example in FIG. 5, since the MSB 550 is equal to one, each of the n−1 MSBs 530 of the magnitude of the signed integer are set equal to the corresponding bit in the n−1 LSBs 535 of the sequence of n bits. In other words, no inversion takes place since the value of the unsigned integer represented by the sequence of n bits is greater than half the maximum possible value.

Again, FIG. 5 also shows that the LSB 545 of the magnitude of the signed integer is set to 1. This is true irrespective of the values of sequence of n bits.

Therefore, by manipulating the bits as described to generate suitable signed integers, the hardware module is capable of generating a distribution centred on zero.

The signed integers are then suitable for conversion to floating point numbers to form a distribution of floating point numbers centred on zero. The hardware module comprises a floating point processing unit for converting the signed integers to floating point numbers.

Figure 8:
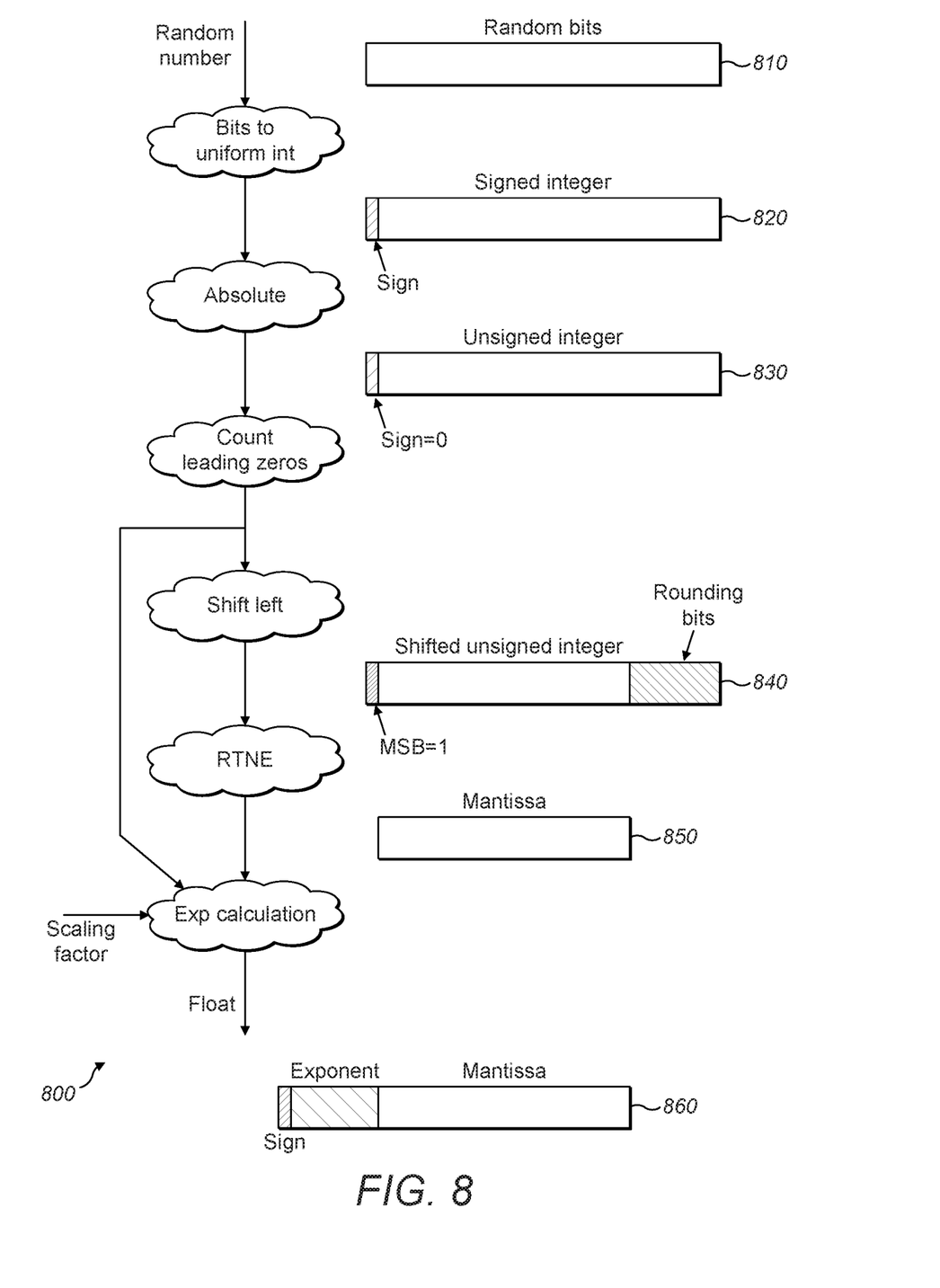
FIG. 8 is a schematic diagram illustrating the process of conversion from a random bit sequence to a floating point number.

Reference is made to FIG. 8, which illustrates the overall process carried out by the hardware module for converting the unsigned integers to floating point numbers.

Initially, a randomly generated bit sequence 810 is provided to the hardware module by a PRNG. The bit sequence 810 is converted to a bit sequence 820 representing a signed integer in accordance with the techniques described above with respect to FIGS. 5 and 6.

The sign bit of the signed integer 820 is set equal to zero to produce the bit sequence 830. The hardware module is then configured to count the number of leading zeros and perform a left shift on the bit sequence 830 until all of the leading zeros are discarded and the MSB is equal to 1. This produces the bit sequence 840.

Since the mantissa of a floating point number typically has fewer bits compared to an input integer. For example, when converting a 32 bit integer to a single precision float, the mantissa has 24 bits. Therefore, 8 bits will be truncated from the 32 bit integer to form the 24 bit mantissa.

The bits removed from the bit sequence 830 are used to round the LSB of the mantissa 840. Any suitable rounding scheme may be applied to achieve this. For example, the rounding scheme round to nearest, even (RTNE) scheme may applied. With this scheme, the LSB of the mantissa is rounded up if the bits that are removed are greater than half the maximum value of the LSB and rounded down if the bits that are removed are less than half the maximum value of the LSB. In the event that the bits removed are equal to half the maximum value of the LSB, the LSB is rounded to the nearest even, i.e. the LSB is rounded up if equal to 1 and rounded down if equal to 0.

The exponent and the sign bit of the floating point number 860 are also calculated by the hardware module. The exponent is determined in dependence upon the number of leading zeros (and therefore the amount of left shift that was performed) of the bit sequence 830. The exponent may also be determined in dependent upon any rounding carry that may result from the rounding process of the mantissa 850. Such a rounding carry will result in the case that the pre-rounding mantissa consists of all ones, and therefore the rounding is propagated along the mantissa to the MSB of the mantissa.

The exponent is calculated using the following formula:

exponent=expBias+expMax−leadingZeroCount+ roundingCarry expBias is equal to the exponent bias (i.e. 127 in single-precision format and 15 in the half-precision format). exp-Max is an offset to provide the maximum possible exponent attainable based on the length of the bit sequence 810. If the bit sequence 810 consists of 32 bits, then expMax is equal to 31. leadingZerocount is the number of leading zeros of bit sequence 830. roundingCarry is the rounding carry that may result if the mantissa 850 consists of all ones.

Figure 6:
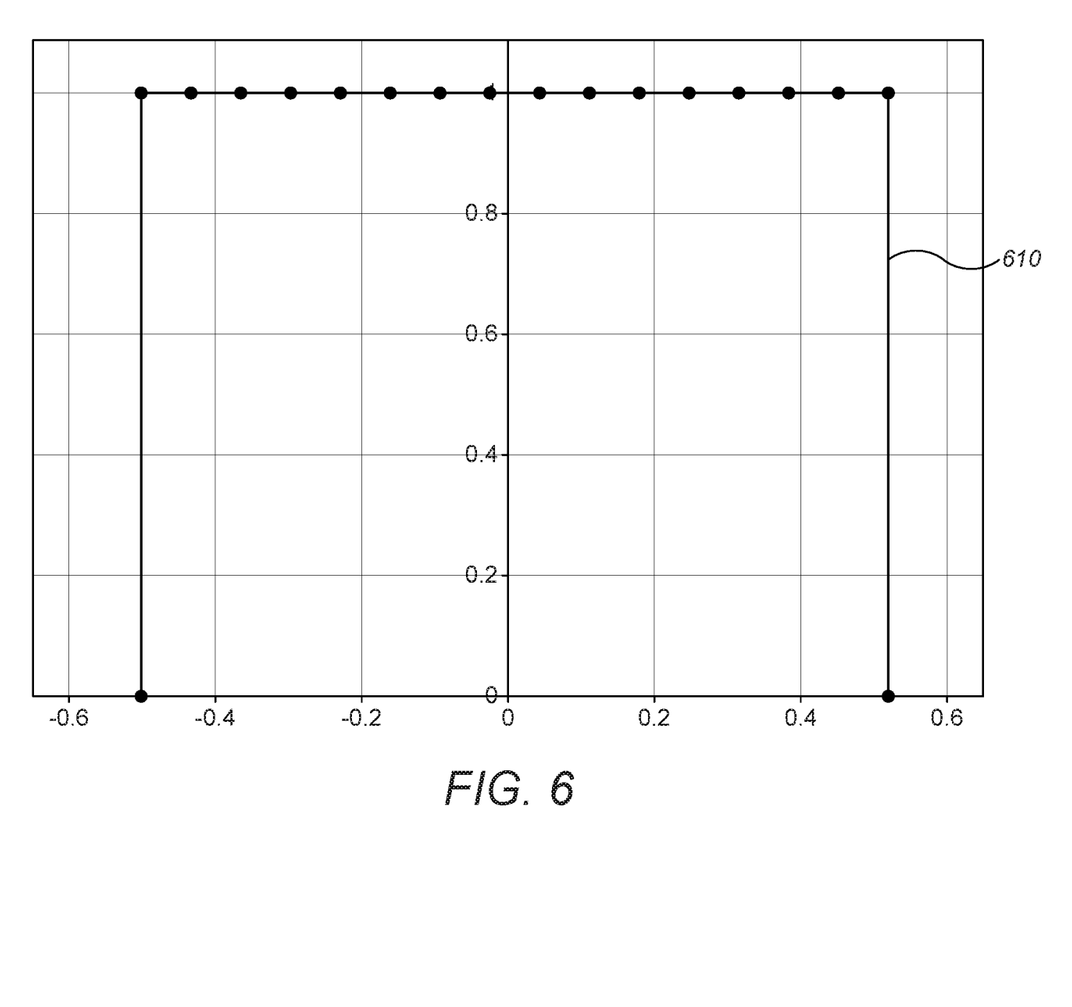
FIG. 6 shows an example of a scaled distribution.

In other examples, the exponent is set equal to −1, so as to obtain a uniform distribution with a range equal to 1. If the exponent is set equal to −1, this would lead to a range of −0.5 to 0.5 for the distribution. FIG. 6 illustrates such a distribution 610.

The sign bit of the floating point number 860 is set equal to the sign bit of the signed integer.

Hence, embodiments of the application provide an apparatus and method for producing signed integers in a distribution centred on zero. The signed integers are suitable for conversion to floating point numbers to obtain a distribution of floating point numbers centred on zero.

The invention claimed is:

1. A system, comprising:
a processing unit;
an instruction memory for the processing unit; and
a hardware module of the processing unit, the processing unit configured to obtain from the instruction memory, an instruction for generating a signed integer from a sequence of n bits supplied to the hardware module, wherein the hardware module comprises circuitry, the circuitry comprising a NOT gate and a plurality of XNOR gates, wherein the circuitry is configured to, in response to the instruction for generating the signed integer:
store the sequence of n bits in a register; and
generate the signed integer comprising a magnitude component and a sign bit by:
detecting a binary state of the most significant bit of the sequence of n bits;
setting, by the NOT gate, the sign bit as the inverse the of most significant bit of the sequence of n bits; and
setting, by the plurality of XNOR gates, each of the n−1 of the most significant bits of the magnitude component to an output binary state in dependence on the detected binary state of the most significant bit of the sequence of n bits, wherein responsive to detecting that the binary state of the most significant bit of the sequence of n bits is one, the output binary state equals the corresponding bit of the n−1 least significant bits of the sequence of n bits.

2. The system of claim 1, wherein the NOT gate is configured to receive the most significant bit of the sequence of n bits and to output the sign bit.

3. The system of claim 1, wherein each XNOR gate is configured to:
receive as an input, the most significant bit of the sequence of n bits;
receive as an input, one of the n−1 least significant bits of the sequence of n bits; and
provide as an output, the corresponding bit of the n−1 most significant bits of the magnitude component.

4. The system of claim 1, wherein the processing unit further comprises a random number generator configured to randomly generate the sequence of n bits.

5. The system of claim 1, wherein the hardware module comprises further circuitry configured to generate a floating point number from the signed integer.

6. The system of claim 5, wherein the further circuitry is further configured to generate a mantissa of the floating point number by:

setting the sign bit of the signed integer equal to zero to produce an unsigned bit sequence;

performing a left shift on the unsigned bit sequence by an amount equal to the number of leading zeros of the unsigned bit sequence; and truncating the shifted unsigned bit sequence to a number of bits specified for the mantissa.

7. The system of claim 6, wherein the further circuitry is further configured to set an exponent of the floating point number in dependence upon the number of leading zeros.

8. The system of claim 5, wherein the further circuitry is further configured to set an exponent of the floating number equal to −1.

9. The system of claim 1, wherein the circuitry is configured to generate the signed integer as part of a distribution centered on zero.

10. The system of claim 9, wherein the hardware module comprises further circuitry configured to generate a plurality of floating point numbers in a distribution centered on zero.

11. The system of claim 1, wherein the circuitry comprises at least one item selected from a list consisting of: an application specific integrated circuit and a field programmable gate array.

12. The system of claim 1, wherein the hardware module comprises further circuitry configured to calculate the magnitude component by:

multiplying the sequence of n bits by two to generate a first intermediate;

adding one to the first intermediate to generate a second intermediate; and subtracting two to the power of n from the second intermediate to form the magnitude component.

13. A method for converting a distribution of unsigned integers to a distribution of signed integers centered on zero, each signed integer comprising a magnitude component and a sign bit, the method comprising generating each of the signed integers by:

obtaining, from an instruction memory for a processing unit, an instruction to generate the signed integer, wherein the processing unit comprises circuitry including a NOT gate and a plurality of XNOR gates; and in response to the instruction:

storing a sequence of n bits in a register;

detecting a binary state of the most significant bit of the sequence of n bits;

setting, by the NOT gate, the sign bit as the inverse of the most significant bit of the sequence of n bits; and setting, by the plurality of XNOR gates, each of the n−1 of the most significant bits of the magnitude component to an output binary state in dependence on the detected binary state of the most significant bit of the sequence of n bits wherein responsive to detecting that the most significant bit of the sequence of n bits is equal to zero, the output binary state equals the inverse of the corresponding bit of the n−1 least significant bits of the sequence of n bits.

14. The method according to claim 13, wherein the method further comprises providing the sequence of n bits as a sequence of randomly generated bits.

15. The method according to claim 13, further comprising generating a floating point number from the signed integer.

16. The method according to claim 13, further comprising generating each of a plurality of floating point numbers including generating a mantissa of the respective floating point number from a respective one of the signed integers by:

setting the sign bit of the respective one of the signed integers equal to zero to produce an unsigned bit sequence;

performing a left shift on the unsigned bit sequence by an amount equal to the number of leading zeros of the unsigned bit sequence; and truncating the shifted unsigned bit sequence to a number of bits specified for the mantissa.

17. The method according to claim 16, further comprising, for each of the floating point numbers, setting an exponent of the respective floating point number in dependence upon the number of leading zeros.

18. The method according to claim 17, further comprising generating the plurality of floating point numbers in a distribution centered on zero.

19. The method according to claim 13, further comprising calculating the magnitude component by:

multiplying the sequence of n bits by two to generate a first intermediate;

adding one to the first intermediate to generate a second intermediate; and subtracting two to the power of n from the second intermediate to form the magnitude component.

20. The method of claim 13, comprising generating a plurality of signed integers in the distribution centered on zero.

21. A non-transitory computer readable medium comprising program instructions for causing a hardware module of a system to carry out a method, the system comprising a processing unit for executing the program instructions and an instruction memory for a processing unit for storing the program instructions, wherein the processing unit comprises circuitry including a NOT gate and a plurality of XNOR gates, the method comprising:

storing a first sequence of n bits on a register, wherein the most significant bit of the first sequence of n bits is one;

generating a first signed integer having a first magnitude component and a first sign bit by:

setting, by the plurality of XNOR gates, each of the n−1 of the most significant bits of the first magnitude component to be equal to a corresponding bit of the n−1 least significant bits of the first sequence of n bits; and setting, by the NOT gate, the first sign bit to be equal to zero; and storing a second sequence of n bits on the register; and generating a second signed integer having a second magnitude component and a second sign bit by:

setting, by the plurality of XNOR gates, each of the n−1 of the most significant bits of the second magnitude component to be equal to an inverse of a corresponding bit of the n−1 least significant bits of the second sequence of n bits; and setting, by the NOT gate, the second sign bit to be equal to one.

22. The non-transitory computer readable medium of claim 21, wherein the most significant bit of the second sequence of n bits is zero.

* * * * *